United States Patent

Rieger et al.

[11] Patent Number: 6,081,658
[45] Date of Patent: Jun. 27, 2000

[54] PROXIMITY CORRECTION SYSTEM FOR WAFER LITHOGRAPHY

[75] Inventors: Michael L. Rieger, Portland; John P. Stirniman, Beaverton, both of Oreg.

[73] Assignee: Avant! Corporation, Fremont, Calif.

[21] Appl. No.: 09/001,715

[22] Filed: Dec. 31, 1997

[51] Int. Cl.[7] .............................. G06F 17/50; G21K 1/087
[52] U.S. Cl. .................................. 395/500.22; 395/500.2; 250/492.22
[58] Field of Search .......................... 395/500.22, 500.2; 250/492.2, 492.22; 364/468.28

[56] References Cited

U.S. PATENT DOCUMENTS

| | | | |
|---|---|---|---|
| 4,812,962 | 3/1989 | Witt | 364/490 |
| 5,051,598 | 9/1991 | Ashton et al. | 250/492.2 |
| 5,182,718 | 1/1993 | Harafuji et al. | 364/490 |
| 5,241,185 | 8/1993 | Meiri et al. | 250/492.2 |
| 5,242,770 | 9/1993 | Chen et al. | 430/5 |
| 5,256,505 | 10/1993 | Chen et al. | 430/5 |
| 5,340,700 | 8/1994 | Chen et al. | 430/312 |
| 5,424,154 | 6/1995 | Borodovsky | 430/5 |
| 5,432,714 | 7/1995 | Chung et al. | 364/525 |
| 5,447,810 | 9/1995 | Chen et al. | 430/5 |
| 5,532,090 | 7/1996 | Borodovsky | 430/5 |
| 5,533,148 | 7/1996 | Sayah et al. | 382/240 |
| 5,553,273 | 9/1996 | Liebmann | 395/500 |
| 5,657,235 | 8/1997 | Liebmann et al. | 364/474.24 |
| 5,825,647 | 10/1998 | Tsudaka | 364/167.03 |
| 5,847,959 | 12/1998 | Veneklasen et al. | 364/468.28 |
| 5,863,682 | 1/1999 | Abe et al. | 430/30 |

OTHER PUBLICATIONS

Michael L. Rieger and John P. Stirniman, "System for Lithography Proximity Compensation," Sep. 10, 1993. No pg #.

John P. Stirniman and Michael L. Rieger, "Wafer Proximity Correction and its Impact on Mask–Making", Bacus News Photomask, Vol. 10, Issue 1, Jan. 1994. No. pg. #.

Michael L. Rieger, John P. Stirniman, Precim Company, "Using behavior modelling for proximity correction", at least as early as Dec. 31, 1994. No pg #.

John P. Stirniman, Michael L. Rieger, Optical/Laser Micro. VIII, "Fast proximity correction with zone sampling", Proc. SPIE 2197 1994, pp. 294–301, at least as early as Dec. 31, 1994.

John Stirniman, Michael Rieger, 14th Annual Bacus Symposium on Photomask Technology and Management, Proc. SPIE 2322 1994, "Optimizing proximity correction for wafer fabrication process", pp. 239–246, at least as early as Dec. 31, 1994.

(List continued on next page.)

*Primary Examiner*—Kevin J. Teska
*Assistant Examiner*—Leigh Marie Garbowski
*Attorney, Agent, or Firm*—Skjerven, Morrill, MacPherson, Franklin & Friel; Omkar K. Suryadevara

[57] ABSTRACT

A system for computing a pattern function for a polygonal pattern having a finite number of predetermined face angles. One method includes the steps of decomposing the polygon into a set of flashes, computing the pattern function by summing together all flashes evaluated at a point (x,y), and the pattern function returning a 1 if point (x,y) is inside a polygon and otherwise will return a 0. Another method for computing a two-dimensional convolution value for any point (x,y) on a polygonal pattern includes the steps of identifying a set of half-plane basis functions corresponding to each face angle of the polygonal pattern, convolving each half-plane basis function with a convolution kernel using integration to find convolved flash (cflash) x,y values, storing the cflash (x,y) values to a two-dimensional look-up table, decomposing the polygonal pattern into a set of flashes where each of the flashes is an instance of the half-plane basis functions, and computing a convolution value for point (x,y) by looking-up a corresponding cflash x,y value for each flash in the table and summing together the corresponding cflash x,y values. The present invention may be used in a method for determining correction steps to which a design layout is to be subjected during wafer proximity correction.

4 Claims, 14 Drawing Sheets

OTHER PUBLICATIONS

OPC Technology & Product Description, "Microcontinuity," copyright 1996 MicroUnity Systems Engineering, Inc. All rights reserved. No pg #.

Michael L. Rieger, John P. Stirniman, "Customizing proximity correction for process–specific objectives," Preprint: SPIE vol. 2726, 1996. No pg #.

Anthony Yen and Alexander Tritchkov, John P. Stirniman, Geert Vandenberghe, Rik Jonckheere, Kurt Ronse, and Luc Van den hove (received May 28, 1996; accepted Aug. 17, 1996), "Characterization and correction of optical proximity effects in deep–ultraviolet lithography using behavior modeling", J. Vac. Sci. Technol. B 14(6), Nov./Dec. 1996, copyright 1996 American Vacuum Society, pp. 4175–4178.

Precim, "Proxima™ Wafer Proximity Correction System", at least as early as Dec. 31, 1997. No. pg #.

Signamask Data Sheet, "Lithas: Optical Proximity Correction Software," at least as early as Dec. 31, 1997. No pg #.

Trans Vector Technologies Inc., "Now Better Quality Photomasks," at least as early as Dec. 31, 1997. No pg. #.

Michael Rieger, John Stirniman, "Mask fabrication rules for proximity–corrected patterns," at least as early as Dec. 31, 1997. No pg #.

"Proxima System," Precim Company, at least as early as Dec. 31, 1997. No pg #.

John P. Stirniman and Michael L. Rieger, "Spatial filter models to describe IC lithographic behavior," at least as early as Dec. 31, 1997. No pg #.-

PROXIMITY CORRECTION SYSTEM FOR WAFER LITHOGRAPHY

BACKGROUND OF THE INVENTION

This invention relates to a proximity correction system for use in wafer lithography, the processing step in semiconductor manufacturing in which circuit design pattern layouts are transferred to the wafer.

Wafer lithography is the processing step in semiconductor manufacturing in which circuit design pattern layouts are transferred to the wafer. During wafer fabrication the physical shapes of circuit elements tend to be distorted. This distortion causes a loss of yield in wafer production because some of the elements do not function. Even if the elements function, the distortion can cause a loss of circuit performance.

The wafer fabrication process involves a series of principle pattern transfer steps including, but not limited to, thermal oxidation or deposition, masking, etching, and doping. In the additive step of thermal oxidation or deposition the wafers are prepared by cleaning, heating, and oxidation. In the masking step, one area of the wafer is protected while another area is exposed. One type of masking is optical lithography in which a metallic coated quartz plate (known as a photomask) having a magnified image of the desired pattern etched into the metallic layer is illuminated.

The illuminated image is reduced in size and patterned into a photosensitive film on the device substrate. The etching step is a subtracting step that sets the pattern.

In the doping step the pattern is treated so that the pattern has the proper electrical characteristics.

As a result the steps of the pattern transfer, images formed on the device substrate generally deviate from the ideal dimensions of the desired pattern. These deviations or proximity errors may be caused by, among other things, distortions in optical proximity (generally caused by imperfect lenses), varying resist thickness over topography, microloading (caused by interactions between chemical activity sites), and light scattering and reflection. In other words, these deviations depend on the characteristics of the patterns as well as a variety of process conditions.

The above mentioned deviations are comprised of both random and systematic components. Random deviations derive from mechanisms based on uncertainty or chance. Systematic deviations, by definition, originate from irregularities in the lithography system. When system states remain constant, systematic errors will repeat. Therefore, systematic errors can be compensated by making offsetting adjustments. There is no way to offset random errors a priori, but there are ways to tighten their distributions with compensation methods.

The methods used to correct errors can be lumped together generally as "correction methodology" in which the complete original chip layout description is used to create a complete corrected chip layout. There are many types of correction methodologies, however, this patent will focus on pattern inversion methods that simulate pattern segments to determine what the features will look like on the fabricated wafer, then, compute adjustments to the pattern shapes based on the difference between the simulated wafer image and the original pattern. Pattern simulation provides a prediction of what the drawn figures will look like on the wafer. Two-dimensional convolution is a key computational element of one type of pattern simulation. Convolution kernels, representing a model of a wafer process, are convolved with the pattern shapes to predict the wafer image.

Proximity correction techniques (or pattern correction methodology) compensate pattern distortions by calculating "inverse" feature shapes (or pattern inversions) to apply to the photomask. When the inverse shapes undergo the expected distortions, shapes actually transferred to the wafer will be true to the "drawn shapes." Constructing inverse shapes typically involves biasing feature edges by an amount dependent upon their local configuration environment.

Key elements of proximity correction technology are the methods for predicting process distortions, and methods for calculating the inverse feature shapes. One type of proximity correction methodology, "rules-based," uses geometric measurements, such as line width and space width, to estimate local configuration environments at every point along feature edges. These width and space measurements are used as indices to a table of "rules" which contain predetermined edge-biasing values. Another type of proximity correction, "model-based," simulates the shapes expected on the wafer, and computes adjustments to the pattern shapes based on the difference between the simulated wafer image and the original pattern. Discussions of model-based proximity correction can be found in "Wafer Proximity Correction and its Impact on Mask-Making" by John P. Stirniman and Michael L. Rieger (*BACUS News Photomask*, Volume 10, Issue 1, pages 1–12, January 1994), "optimizing proximity correction for wafer fabrication process" by John P. Stirniman and Michael L. Rieger (14*th Annual BACUS Symposium on Photomask Technology and Management*, Proc. SPIE 2322 1994, pages 239–246), and "Fast proximity correction with zone sampling" by John P. Stirniman and Michael L. Rieger (*Optical/Laser Micr.* VII, Proc. SPIE 2197 1994, pages 294–301).

FIGS. 1A and 1B show a system for applying wafer proximity correction. First an original drawn shapes or design layout 10 is created (an example of an original pattern is shown in FIG. 12A). Second, as shown in FIG. 1A, the layout pattern 10 is etched into a standard mask 12. The pattern 10 is then captured on a wafer using the above described lithography process during which the pattern 10 is subject to optical effects 14, resist effects 16, and etch effects 18. The result is an uncorrected wafer structure 20 with the deviations discussed above (FIG. 12B shows the original pattern with an uncorrected wafer structure overlay). From the deformations in the uncorrected wafer structure 20, the type of wafer proximity correction needed for this specific set of optical effects 14, resist effects 16, and etch effects 18 is determined. Using this information, as shown in FIG. 1B, the design layout 10 is subjected to wafer proximity correction 30. A corrected mask 32 is then formed that is designed to correct the deformations. Using the corrected mask 32 in the above described lithography process, the pattern 10 is subjected to the same optical effects 14, resist effects 16, and etch effects 18. The result is a corrected wafer structure 40 with significantly fewer deviations.

BRIEF SUMMARY OF THE INVENTION

The key to producing high quality wafers is the system of proximity correction. The present invention is directed to improvements in proximity correction. Specifically, the present invention uses a process model which is a unique set of convolution kernels and other parameters which specify the behavior of a particular wafer process. Further, the present invention may include a correction recipe that is a programmable specification of pattern inversion behavior.

The present invention includes a method for computing a pattern function for a polygonal pattern having a finite number of predetermined face angles. The method includes the first step of decomposing the polygon into a set of flashes where each flash is an instance of a half-plane basis function. The next step of the method is to compute the pattern function by summing together all flashes evaluated at a point (x,y). The pattern function will return a 1 if point (x,y) is inside a polygon and otherwise will return a 0.

The present invention also includes a method for computing a two-dimensional convolution value for any point (x,y) on a polygonal pattern. The first step of this method is to identify a set of half-plane basis functions corresponding to each face angle of the polygonal pattern. Next, each half-plane basis functions is convolved with a convolution kernel using integration to find convolved flash (cflash) x,y values. The cflash (x,y) values are then stored to a two-dimensional look-up table. Then the polygonal pattern is decomposed into a set of flashes where each of the flashes is an instance of the half-plane basis functions. Finally, for point (x,y), a convolution value is computed by looking-up a corresponding cflash x,y value for each flash in the table and summing together the corresponding cflash x,y values.

One specific application of the present invention is that it can be used in a method for determining correction steps to which a design layout is to be subjected during wafer proximity correction. Specifically, this application includes the step of subjecting a characterizing pattern to lithography and wafer processes to produce an uncorrected test wafer. The next step is forming a proximity behavior model using measurements of critical dimensions of the uncorrected test wafer. Next a correction recipe is formed with the proximity behavior model. Then a new IC layout design is subjected to proximity correction to produce proximity corrected output. A corrected mask is then formed using the proximity corrected output. Finally, using the corrected mask, a wafer is subjected to lithography and wafer processes to produce a corrected production wafer.

The foregoing and other objectives, features, and advantages of the invention will be more readily understood upon consideration of the following detailed description of the invention, taken in conjunction with the accompanying drawings.

DETAILED DESCRIPTION OF THE PREFERRED EMBODIMENT

Figure 1A:
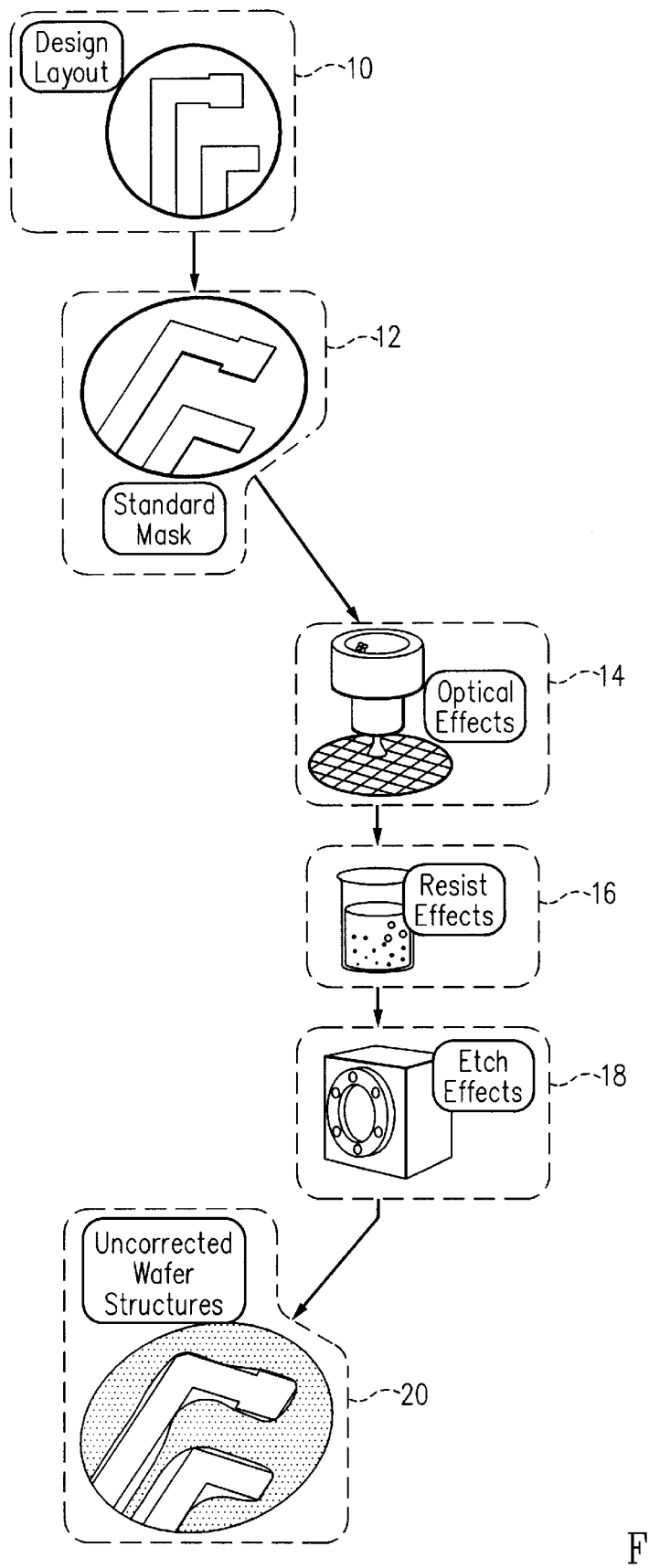
FIG. 1A is a flow chart of the creation of an uncorrected wafer using a standard mask.

The present invention is directed to a method for calculating two-dimensional convolutions on polygon data that can be used to simulate process behavior for applications. The layout design 10 (FIGS. 1A and 1B) may be input into a wafer proximity correction module 30 (FIGS. 1B and 2) that allows for optimum shape manipulation.

Figure 1B:
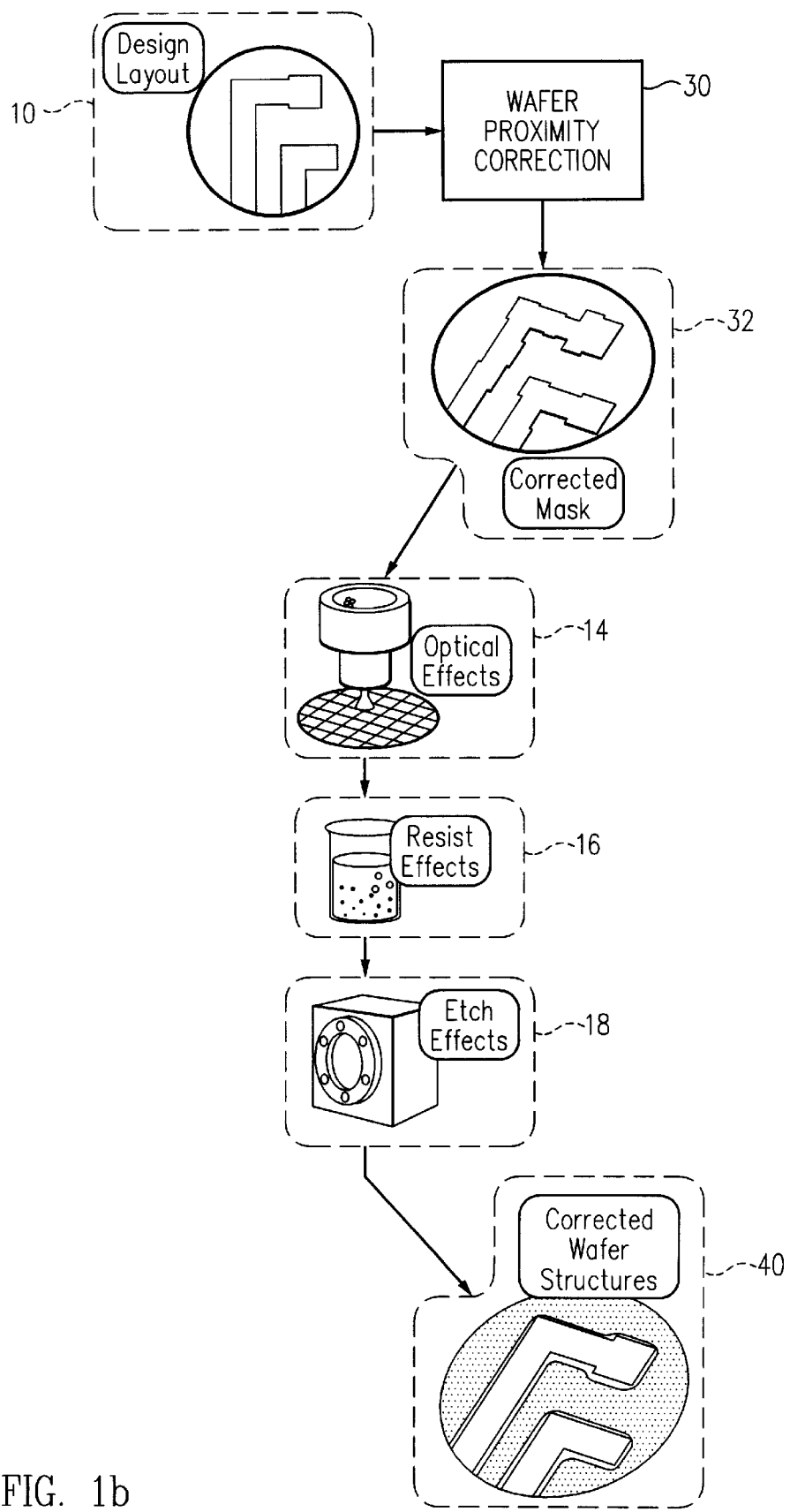
FIG. 1B is a flow chart of the creation of a corrected wafer using a mask corrected by wafer proximity correction.
Figure 2:
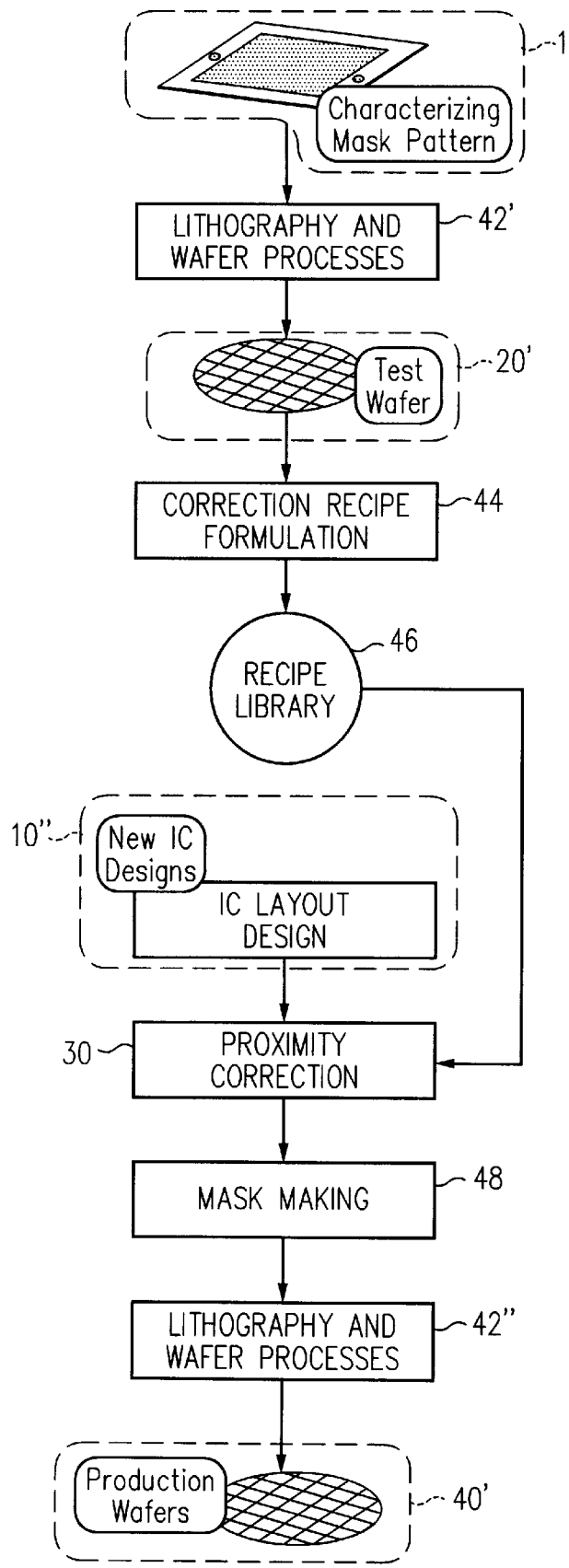
FIG. 2 is a flow chart of the process for forming and use of a recipe library.

FIG. 2 shows a process used to determine the corrections to which the design layout 10 (FIG. 1B) is to be subjected during wafer proximity correction 30 in order to form the corrected mask 32 (FIG. 1B). First, a characterizing mask pattern 10' is subjected to lithography and wafer processes 42' that include the optical effects 14, resist effects 16, and etch effects 18 discussed above. The resulting uncorrected wafer 20 (FIG. 1A) is a test wafer 20'. Using measurements of dimensions of features in the test wafer 20', a proximity behavior model is formed that is used in the formation of a correction recipe 44 that is incorporated into a recipe library 46. The correction recipes in the library 46 are formulated and verified to meet user-specified correction objectives (for example, minimizing dimensional variation, setting dimensional limits, maximizing process window latitudes, and reducing corner rounding) and constraints (for example, mask address grid, minimum mask feature size, correction shape symmetries, and figure count limits).

Using the recipe library 46, new IC layout designs 10", which may be in GDS-II Stream format, are subjected to proximity correction 30. The output of the proximity correction 30, which may be in GDS-II form, is used to create the corrected mask 32 (FIG. 1B) formed in the mask making step 48. Using the corrected mask 32, the wafer is subjected to lithography and wafer processes 42" that include the optical effects 14, resist effects 16, and etch effects 18 discussed above. The resulting corrected wafer 40 (FIG. 1B) is a production wafer 40".

As mentioned in the background, this patent will focus on correction methodology that uses pattern inversion methods that simulate pattern segments to determine what the features will look like on the fabricated wafer, then, while iteratively re-simulating, adjusting the pattern shapes until the predicted wafer image matches the original drawn pattern. Inversion behavior is controlled by way of user-programmable "recipes" such as the correction recipes of the present invention. The present invention also uses programmable convolution kernels, which form the process model, for pattern simulation.

Figure 3A:
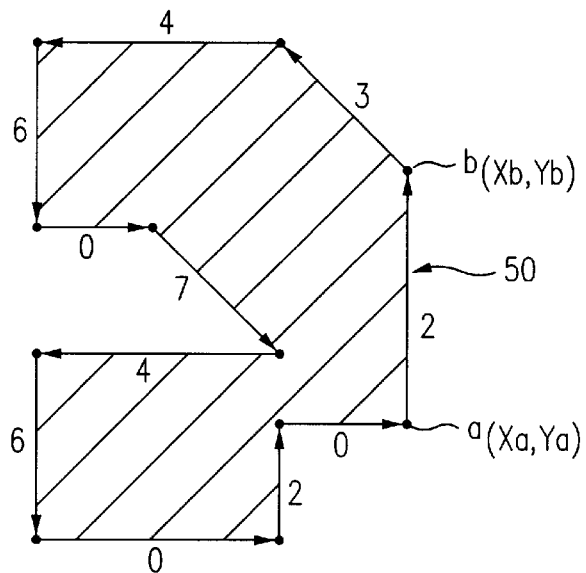
FIGS. 3A–3B are exemplary patterns composed of only closed simple polygons.
Figure 3B:
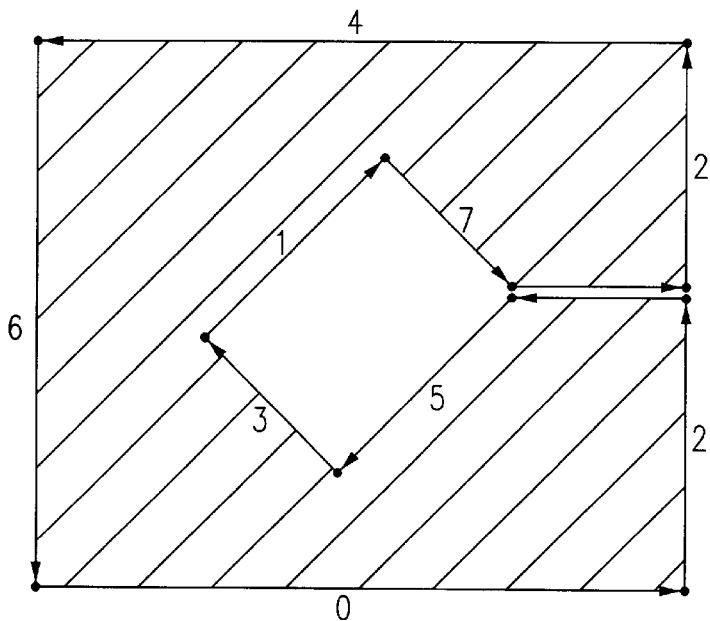

Model generation in the present invention is based on two-dimensional convolution theories which are based on certain predetermined assumptions. First, a convolution kernel is a function that has a finite extent or, in other words, is ø beyond some finite distance from center. Second, the pattern is composed of only closed simple polygons. Examples of patterns within these constraints are shown in FIGS. 3A and 3B. The face angles, the angle of the polygons boundary between any two adjacent vertex coordinates enumerated counterclockwise around each polygon, are restricted to a discrete set of angles. For example, the discrete set of angles may be 0°, 45°, 90°, 135°, 180°, 225°, 270°, 315°, but the algorithm is extendable to any finite number of angles. The face angles of FIGS. 3A and 3B are labeled according to Table 1.

TABLE 1

| Angle | Case |
|---|---|
| 0° | 0 |
| 45° | 1 |
| 90° | 2 |
| 135° | 3 |
| 180° | 4 |
| 225° | 5 |
| 270° | 6 |
| 315° | 7 |

One face 50, for example, is defined between point a $(x_a, y_a)$ and point b $(x_b, y_b)$. Face 50 has a direction of 90° and a case of 2.

To facilitate the interpretation of polygons as two-dimensional functions, the value inside is set to equal 1 and the value outside is set to equal 0.

$$\text{value}_{inside} = f(x,y) = 1$$
$$\text{value}_{outside} = f(x,y) = 0$$

This is the definition of a polygon function.

Figure 4A:
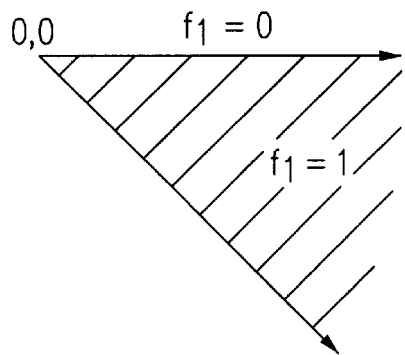
FIGS. 4A–4C are basis functions used for pattern representation.
Figure 4B:
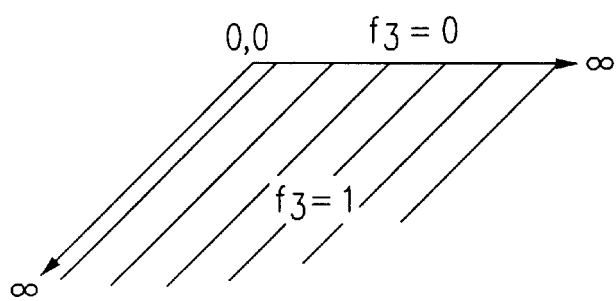
Figure 4C:
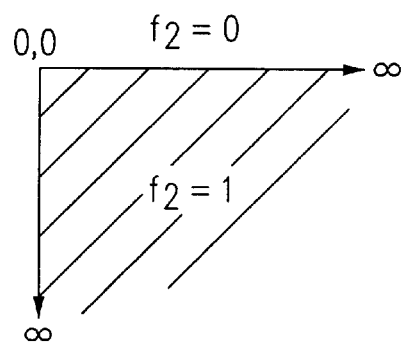
Figure 5:
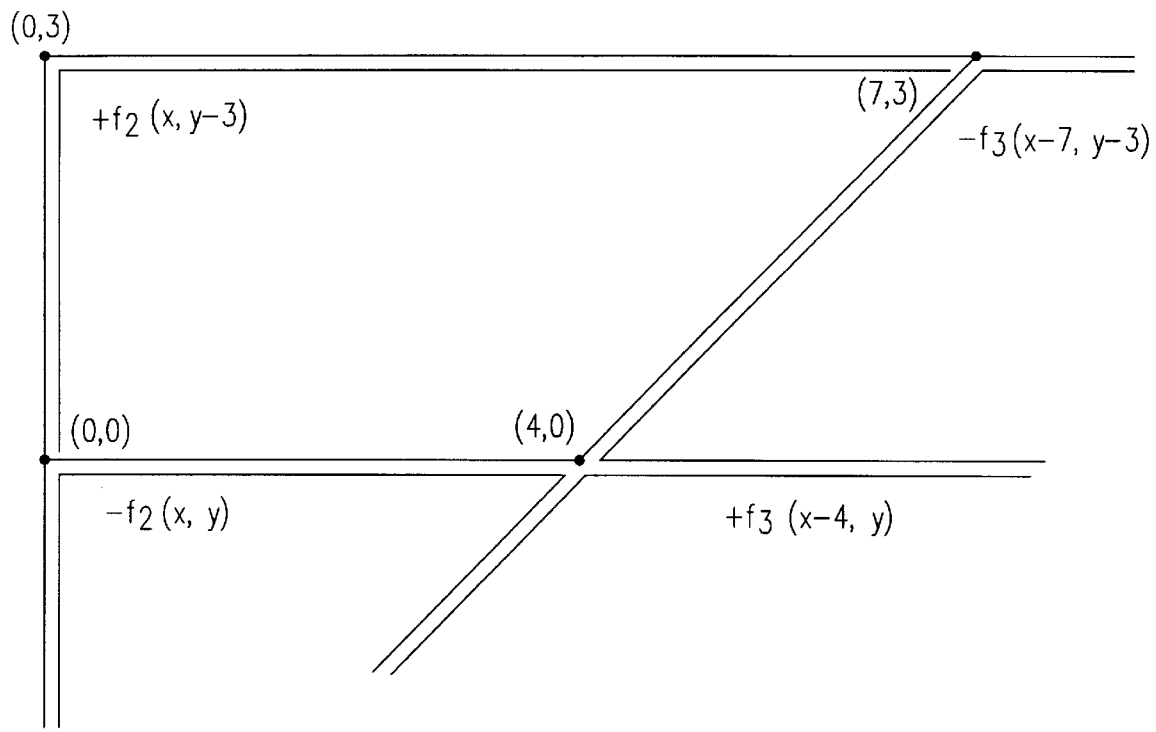
FIG. 5 is a exemplary polygon defined using the basis functions of FIGS. 4A–4C.

Within constraints, any such pattern can then be represented as the linear sum of the basis functions when the basis functions are "half-planes" such as those set forth in FIGS. 4A, 4B, and 4C. Each half plane basis function divides the Euclidean plane into two regions. The basis function evaluates to 1 where (x,y) is in one region, and it evaluates to 0 otherwise. With polygon space defined as 1 and 0, any polygon can be represented as the sum of half-plane basis functions which are positioned and weighted properly (with polygon space defined as 1 and 0, the weights are +1 or −1). For clarity, each instance of a positioned and weighted basis function is called a flash. FIG. 5 shows an example of a polygon defined using the functions $f_2$ and $f_3$ of FIGS. 4B–4C. The "value" of any point (x,y) in FIG. 5 can be determined by:

$$value(x, y) = flash_{type2}(x - 0, y - 3) - flash_{type2}(x - 0, y - 0) - flash_{type3}(x - 7, y - 3) + flash_{type3}(x - 4, y - 0)$$

A flash is parameterized with four parameters, an offset coordinate (u,v), weight (wgt) (usually +1 and −1), and type (1, 2, or 3 for the 8-direction constraint illustrated here). The evaluation of a flash at an input coordinate (x,y) is given by the following equation:

$$fvalue[i, x, y] = value(flash[i], x, y)$$
$$= wgt_i \cdot flash[type(i)](x - u_i, y - v_i)$$

Therefore the pattern value, pvalue, at (x,y) is given by the sum of the evaluations of (x,y) at each of the flashes:

value[pattern,x,y]=sum[i=1 to $N_f$] (fvalue[i,x,y])

This provides a pattern function for any pattern containing non-overlapping polygons whose face angles are constrained to angles corresponding to the half-plane basis functions. For any given (x,y) point coordinate, this function will return 1 if the location is inside a polygon or 0 if it is outside a polygon. Further, if polygons overlap, this function will return an integer indicating the number of overlapping polygons at a point.

The following basic method for decomposing a constrained polygon is applied to each polygon face for every polygon in the pattern space. Polygon vertices are traversed counter-clockwise to examine each face formed by two adjacent vertices a and b. First, for each polygon face, either two flashes are created or no flashes are created, depending on the face angle formed between $(x_a, y_a)$ and $(X_b, y_b)$ Using the notation set forth above, a flash table is created. Using the angle and case from Table 1, the flash parameters are as follows:

TABLE 2

| Case | Angle | Create Flash With Parameters |
|---|---|---|
| 0 | 0° | do nothing |
| 1 | 45° | $-f_3(b) + f_3(a)$ |
|  |  | vertex a: u = $x_a$, v = $y_a$, type = 3, wgt = 1 |
|  |  | vertex b: u = $x_b$, v = $y_b$, type = 3, wgt = −1 |
| 2 | 90° | $-f_2(b) + f_2(a)$ |
|  |  | vertex a: u = $x_a$, v = $y_a$, type = 2, wgt = 1 |
|  |  | vertex b: u = $x_b$, v = $y_b$, type = 2, wgt = −1 |
| 3 | 135° | $-f_1(b) + f_1(a)$ |
|  |  | vertex a: u = $x_a$, v = $y_a$, type = 1, wgt = 1 |
|  |  | vertex b: u = $x_b$, v = $y_b$, type = 1, wgt = −1 |
| 4 | 180° | do nothing |
| 5 | 225° | $+f_3(a) - f_3(b)$ |
|  |  | vertex a: u = $x_a$, v = $y_a$, type = 3, wgt = −1 |
|  |  | vertex b: u = $x_b$, v = $y_b$, type = 3, wgt = 1 |
| 6 | 270° | $+f_2(a) - f_2(b)$ |
|  |  | vertex a: u = $x_a$, v = $y_a$, type = 2, wgt = −1 |
|  |  | vertex b: u = $x_b$, v = $y_b$, type = 2, wgt = 1 |
| 7 | 315° | $+f_1(a) - f_1(b)$ |
|  |  | vertex a: u = $x_a$, v = $y_a$, type = 1, wgt = −1 |
|  |  | vertex b: u = $x_b$, v = $y_b$, type = 1, wgt = 1 |

For example, in FIG. 3A, the face defined between points a and b has a 90° direction angle. Accordingly, its case is 2. Two flashes would be created. The first would have the parameters vertex a: $u=x_a$, $v=y_a$, type=2, wgt=1. The second would have the parameters vertex b: $u=x_b$, $v=y_b$, type=2, wgt=−1.

It should be noted that the number of flashes $N_f$ created for any polygon is in the range:

$$N_v \leq N_f \leq 2 \cdot N_v$$

where $N_v$ is the total number of polygon vertices in the pattern. For a given polygon input pattern (which may have one or more polygons) a table of lashes can be generated by applying the above algorithm to every face on every polygon in the input pattern. This results in $N_f$ flashes per constraints given. To determine the pattern function at any point in the pattern space, all of the flashes in the table must be summed together so that the amount of work for each convolution value is $O(N_f)$. In other words, the work performed to evaluate the pattern function at one point (x,y) is $O(N_f)$.

A two-dimensional convolution is a function is defined as the following linear operation on two functions, p and k.

$$c(x, y) = \int_{-\infty}^{+\infty} \int_{-\infty}^{+\infty} k(u, v) \cdot p(x - u, y - v) du\, dv$$

This may be referred to as $c = p \otimes k$. Where p is the pattern function and k is a kernel, this operation is the convolution of a pattern with a kernel. For example, if k represents a point spread function for some process, the convolution of any pattern with k will provide the simulated image distribution for the pattern with that process.

imaged distribution=$p \otimes k$

It should be noted that real imaging systems require a set of k's for accurate modelling.

imaged distribution=$f_m(p \otimes k_0, p \otimes k_1, \ldots p \otimes k_n)$

As mentioned above, a pattern function can be implemented as the superposition of weighted, positioned half-plane basis functions. Accordingly, the half-plane basis functions may be replaced with convolution functions of the original half-plane function convolved with a kernel. For clarity each instance of such a convolved basis function is called a cflash.

$$cfvalue(i, x, y) = value(cflash_i, x, y) = wgt_i \cdot cflash_{typei}(x-u_i, y-v_i)$$

Because the convolution function and the pattern function are both linear, the pattern function form can be used to compute a convolution on any pattern. Where a pattern has been converted to a pattern function (pvalue), the convolution value function for that pattern and a kernel can be computed by:

$$cvalue\ (pattern, x, y) = sum[i=1\ to\ N_f] cfvalue(i, x, y)$$

cfvalue is obtained by looking up the value from the pre-computed tables.

The advantage of this approach is that the numerical integration is not applied to the pattern. Instead, numerical integration is used one-time on the basis functions and the results are stored in tables.

Figure 6:
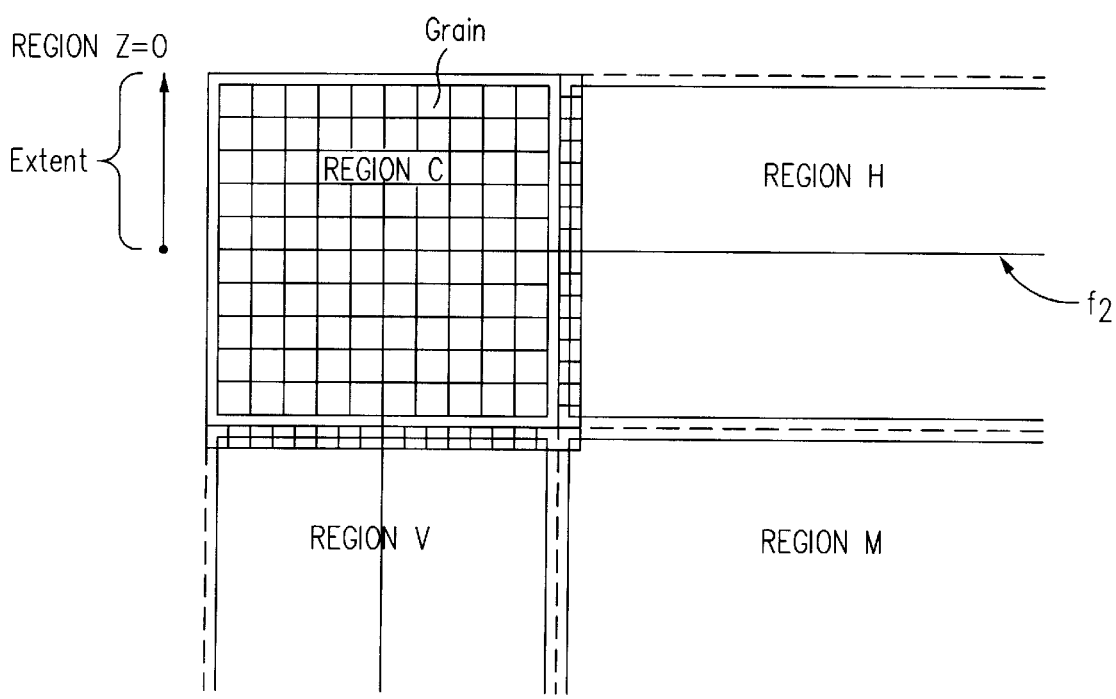
FIG. 6 is an exemplary function showing regions Z, C, H, V, and M.

Pre-computed data is generated on a sample grid. The accuracy of the table representation depends on the fineness (or grain) of this grid. FIG. 6 shows one method for structuring a data table to hold pre-computed convolution values for a cflash. Because the convolutions on half-planes extend to infinity, each cflash is decomposed into zones. For each zone a finite number of table values are stored, depending on the grain of the pre-computed data.

To determine the cfvalue(cflash$_i$,x,y) from a cflash stored as a table, three basic steps are taken. First, using any of a number of numerical comparison methods, it is determined into which zone (z, c, h, v, m) the point falls. Second, the nearest table entry is looked-up. Third, the cfvalue is interpolated using any known interpolation method.

Figure 7:
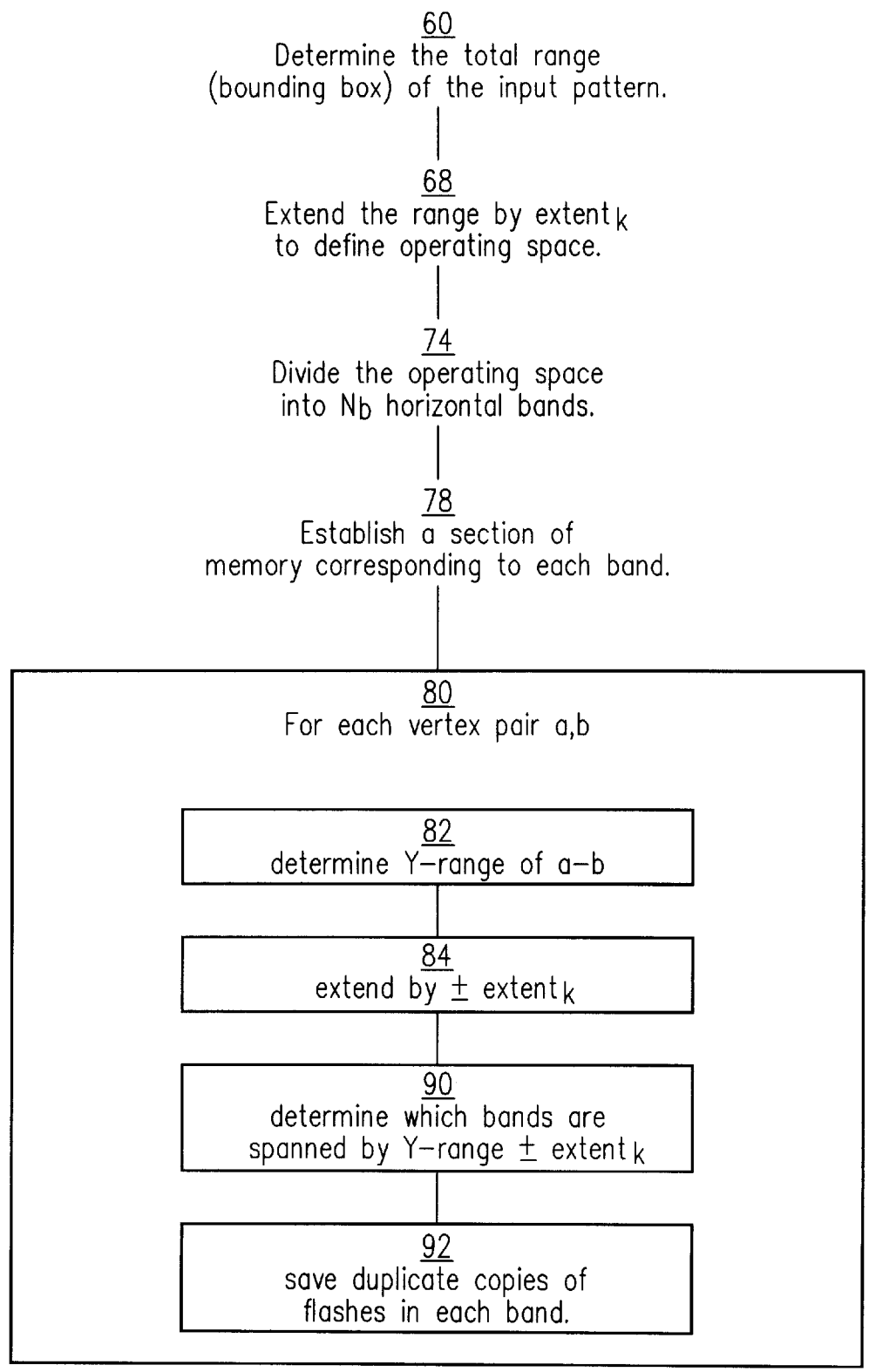
FIG. 7 is a flow chart of the optimization technique for optimizing the work performed to evaluate p⊗k.
Figure 8:
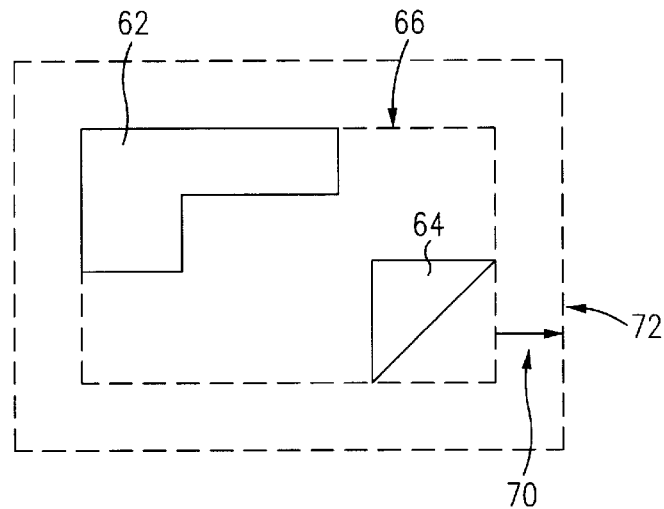
FIG. 8 is an exemplary pattern surrounded by a bounding box and an operating space.
Figure 9:
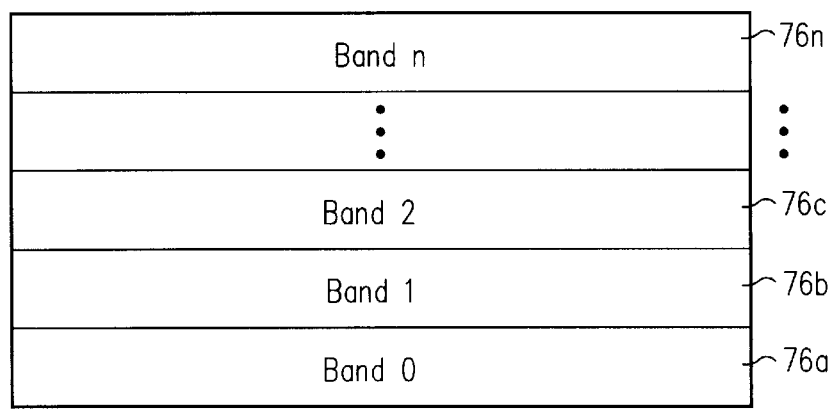
FIG. 9 is an operating space divided into bands.

The present invention uses several optimization techniques to enhance the proximity correction for wafer fabrication processes. The optimization technique for optimizing the work performed to evaluate p⊗k is shown in FIG. 7. The goal of this optimization is to prevent unnecessary look-ups of flashes in regions where it can be determined that the evaluation of those flashes will have no effect. First, the total range (also called the bounding box) of the pattern is determined 60. FIG. 8 shows an exemplary pattern 62, 64, surrounded by a bounding box 66. Next, the range is extended 68 by extent$_k$ 70 to define operating space 72. The operating space 72 is then divided 74 into Nb horizontal bands 76a–76n (FIG. 9). A section of memory corresponding to each band 76a–76n is then established 78.

Figure 10:
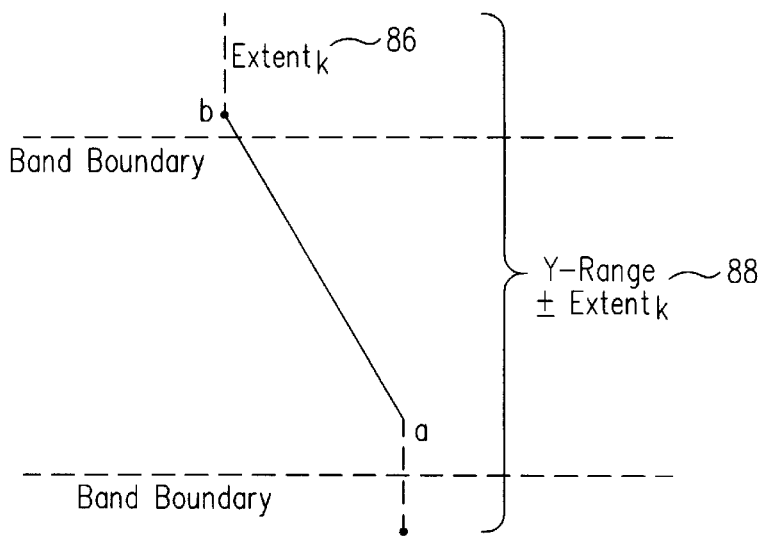
FIG. 10 is a graph of a vertex pair (a,b) with a Y-range extended by ± $extent_k$.

Next, as shown in FIG. 7, for each vertex pair (a,b) 80 the Y-range of (a,b) is determined 82, the Y-range is then extended 84 by ± extent$_k$ 86. FIG. 10 shows the Y-range extended by ± extent$_k$ 88. The next step is to determine which bands are spanned by Y-range ± extent$_k$ 90 and save duplicate copies of flashes in each band 92 to memory.

When evaluating p⊗k for a point (x,y), it is then determined in which band the point falls. The flashes stored for that band may then be used to compute the value. The number of flashes in a band is usually much smaller than the number of flashes needed for the whole pattern, thus the work required to compute a convolution value is reduced. Using the above set forth system, the work performed to evaluate one point is within the following range:

$$O(N_f/N_b) < work < O(N_f)$$

The memory requirement is in the following range:

$$O(N_f) < memory < O(N_f N_b)$$

Exactly what point in these ranges depends on the specific geometries of the pattern. A performance/memory trade-off is made when determining $N_b$. Further optimization to decrease the work required for evaluating convolutions is illustrated by the following pseudocode:

```
FOR EACH BAND b = 1 to Nb
{
  FOR EACH FLASH f = 1 to Nfb in BAND b.
  {
    DETERMINE H, L, Left, and Right (per FIG. 11)
    SAVE H, L, Left, and Right.
    Initialize STATUS = "unpaired"
  } NEXT FLASH f
  SORT FLASHES in BAND b by following priorities:
    H
    weight
    Right
    Left
  FOR EACH FLASH f = 1 to Nfb-1 in BAND b
  {
    FOR EACH FLASH c = f+1 to Nfb in BAND b
    {
      compare FLASH c to FLASH f
      IF {         Hf = Hc
        AND weightf = - weightc
        AND STATUSc = "unpaired"
        AND STATUSf = "unpaired"
      } THEN
      IF (Rightf > Rightc) THEN
        ASSIGN Rightc the value of Rightf
      ELSE
        ASSIGN Rightf the value of Rightc
      ENDIF
      ASSIGN STATUSf = "paired"
      ASSIGN STATUSc = "paired"
    ENDIF
    } NEXT FLASH c
  } NEXT FLASH f
} NEXT BAND b.
```

Figure 11:
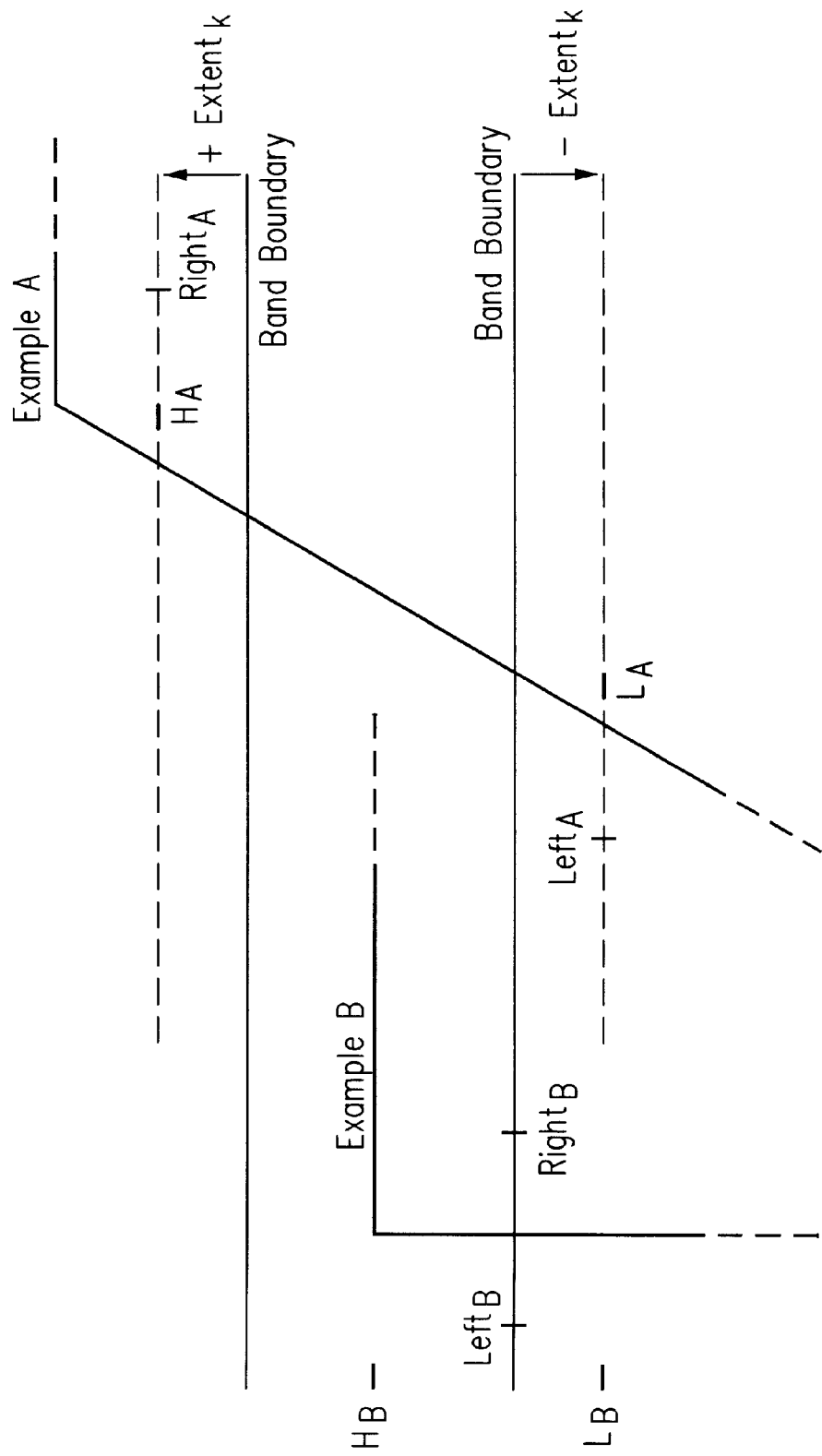
FIG. 11 is a graph of two examples of an optimization algorithm.

The pseudo-code above further optimizes the algorithm by sorting the flashes horizontally in each band and by providing some additional information fields to each flash. When the flashes are accessed during a convolution operation, the additional information can be used to allow the convolution function to skip evaluations of certain flashes. In addition to the u, v, weight, and type data fields, the fields L (low), H (high), Right, Left, and STATUS are added. Then the flashes in each band are rearranged and values to the additional data fields are assigned. For each flash in one band, the L, H, Right, and Left values are calculated as shown in FIG. 11. The STATUS field for each flash is then initialized to "unpaired." After these values have been assigned to each flash in one band, these flashes are sorted, in ascending order, by the following keys: H, weight, Right, Left. Then, each flash (f) is compared to every other flash (c) in the band. f is then incremented from flash 1 to flash N-1. For each increment of f, c is incremented from f+1 to N. For each comparison, if the following conditions are true: Hf=Hc and weightf=-weightc and STATUSc="unpaired" and STATUSf="unpaired" then the data fields in both flashes is modified. If Rightf is greater than Rightc then the value of Rightc is assigned to Rightf. On the other hand, if Rightf is less than or equal to Rightc then the value of Rightf is assigned to Rightc. Next, the STATUS fields for both flashes is assigned to "paired." After the last two flashes are compared (f=N-1, c=N), the process is repeated for the next band. When all bands have been processed, the H, Left, and Right fields can be used to speed up evaluations. When the flashes in a band are traversed to compute a convolution value, the y coordinate of the evaluation point is compared to H. If y is greater than H, then the evaluation of that flash (look up value) can be skipped. Further, if x is less than Left or x is greater than Right the evaluation of that flash may also be skipped. In practice, this enhancement to the algorithm decreases convolution computation work by a factor of 2 to 3.

Figure 12A:
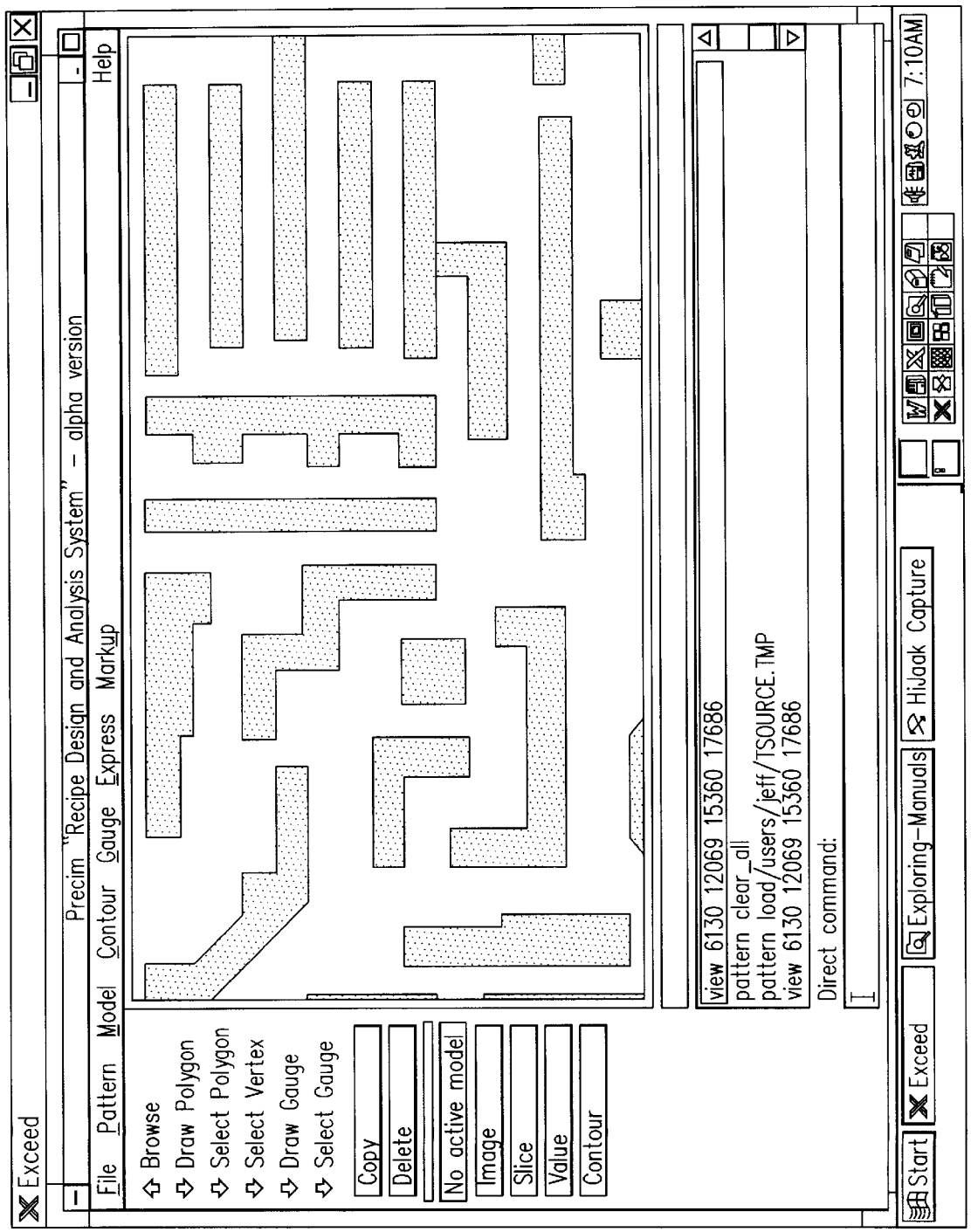
FIGS. 12A–12E are graphical representations of the screens of the invention.
Figure 12B:
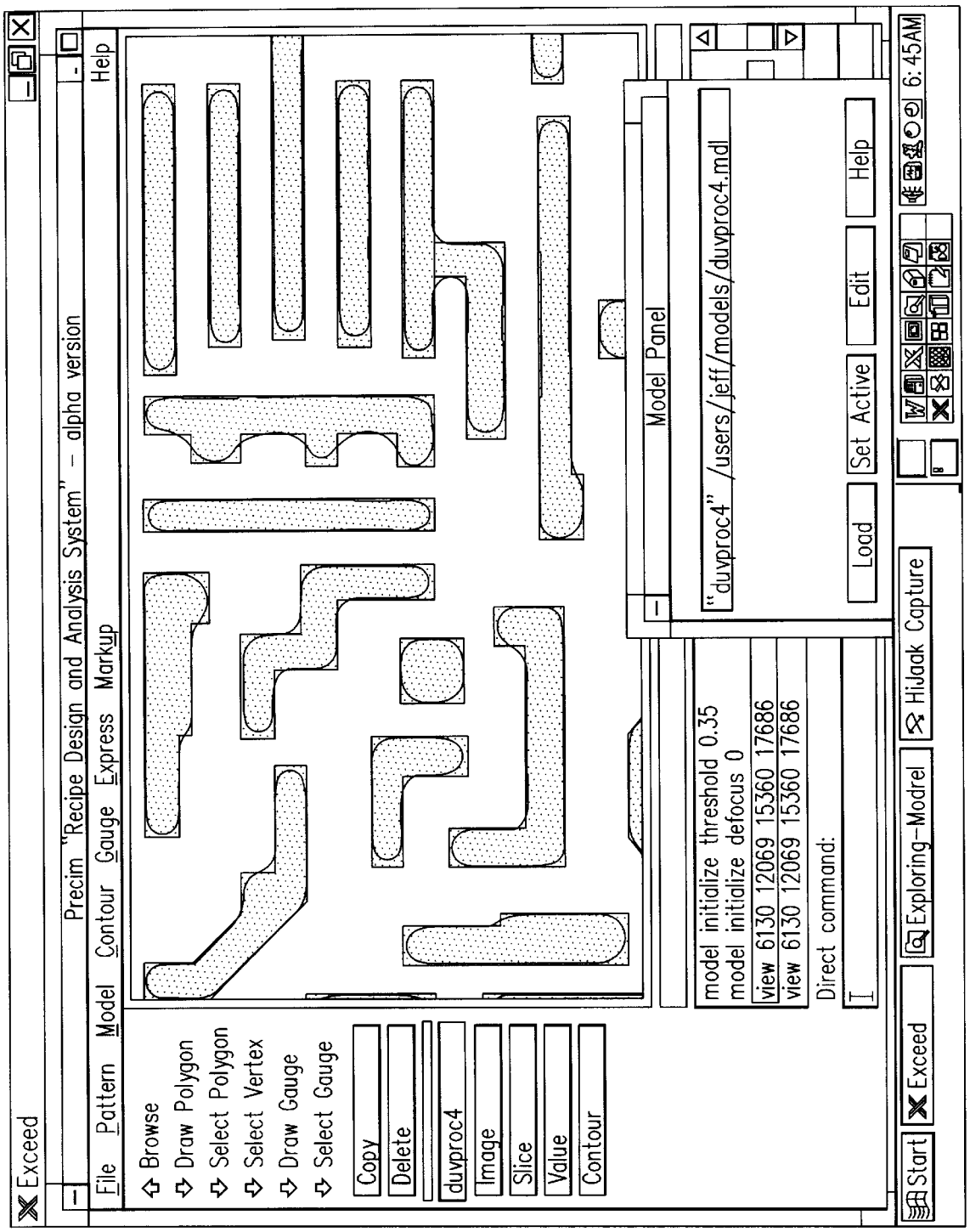
Figure 12C:
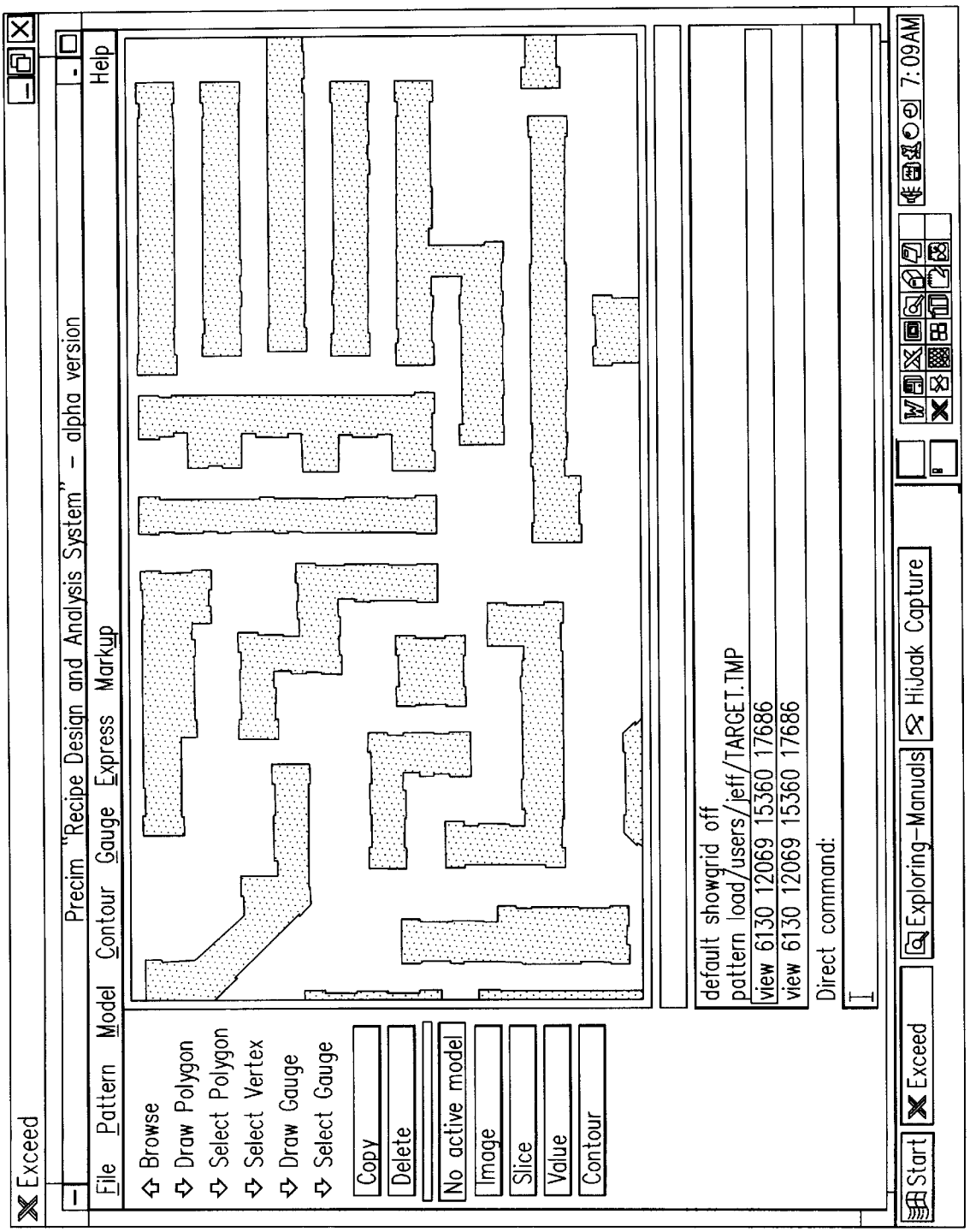
Figure 12D:
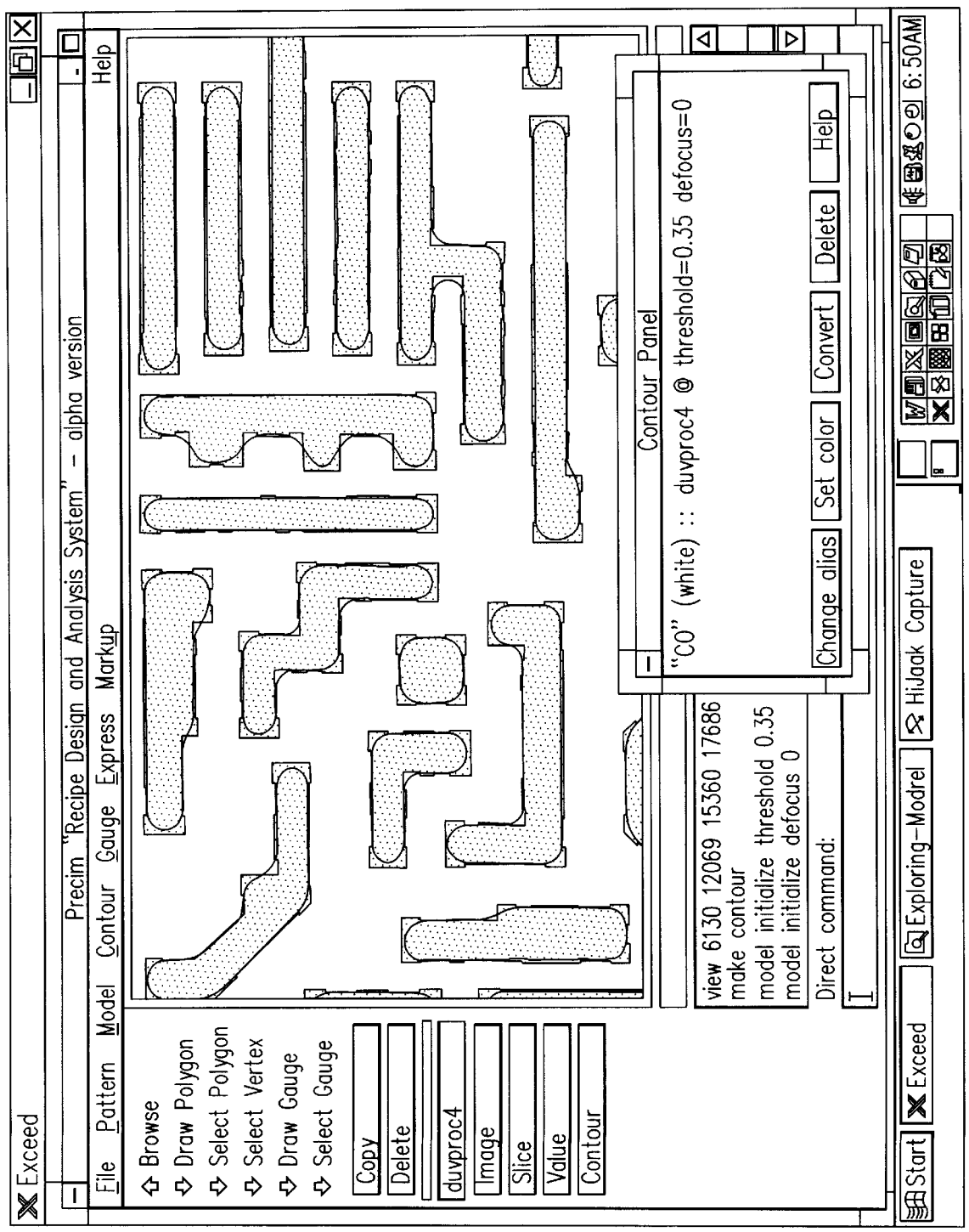
Figure 12E:
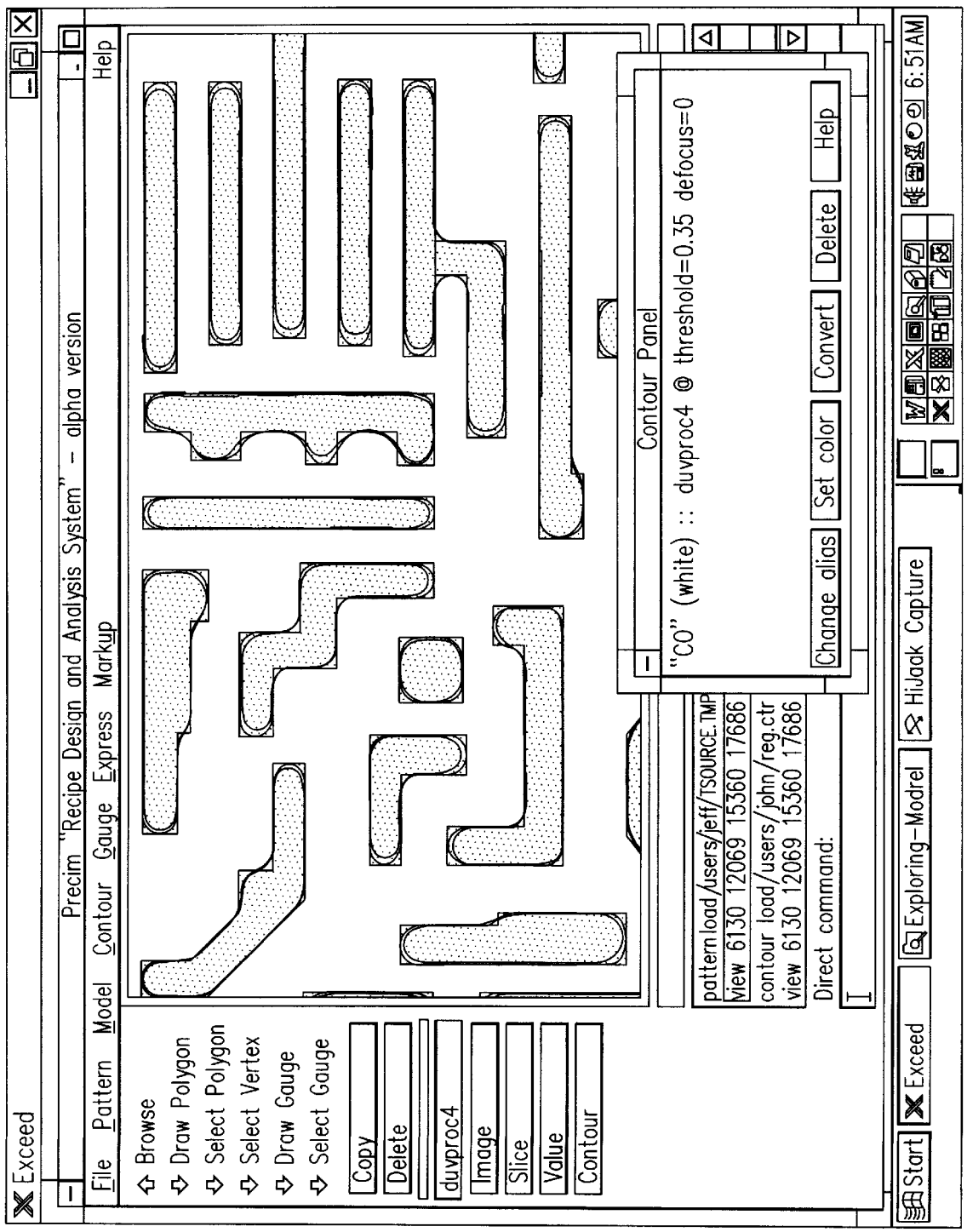

FIGS. 12A–12E are graphical representations of the screens used in a method for applying wafer proximity correction. An original design layout pattern, an example which is shown in FIG. 12A, is etched into a standard mask. The pattern is then captured on a wafer using a lithography process to result in an uncorrected wafer structure such as that shown in FIG. 12B (which shows the original pattern with an uncorrected wafer structure overlay). From the deformations in the uncorrected wafer structure, the type of proximity correction needed is determined. The design layout is then subjected to wafer proximity correction to form a corrected mask such as that shown in FIG. 12C. Then, using the corrected mask in the lithography process, the original pattern is subjected to the lithography process to result in a corrected wafer structure with significantly smaller deviations. FIG. 12D shows the corrected pattern with the resulting mask and FIG. 12E shows the original pattern with both the before and after contours.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A method for performing proximity correction on design layouts, said method for correction comprising the steps of:
   (a) forming a process model using one or more convolution kernels to simulate wafer image distribution;
   (b) convolving an original design layout with said convolution kernels to obtain a simulated wafer image;
   (c) iteratively adjusting shapes of said original design layout until said simulated wafer image coincides with said original design layout to produce proximity corrected output;
   (d) creating a corrected mask using said proximity corrected output; and
   (e) using said corrected mask, subjecting a wafer to lithography and wafer processes to produce a corrected production wafer.

2. A method for determining correction steps to which a design layout is to be subjected during wafer proximity correction, said method for determining comprising the steps of:
   (a) subjecting a characterizing pattern to lithography and wafer processes to produce an uncorrected test wafer;
   (b) forming a proximity behavior model using measurements of critical dimensions of said uncorrected test wafer;
   (c) forming a correction recipe from said proximity behavior model;
   (d) subjecting a new IC layout design to proximity correction to produce proximity corrected output, said proximity correction using said recipe library;
   (e) creating a corrected mask using said proximity corrected output; and
   (f) using said corrected mask, subjecting a wafer to lithography and wafer processes to produce a corrected production wafer.

3. Method for computing a pattern function for a polygonal pattern, said polygonal pattern having a finite number of predetermined face angles, said method comprising the steps of:
   (a) identifying a set of half-plane basis functions corresponding to each of said face angles;
   (b) decomposing the polygon into a set of flashes where each flash is an instance of a half-plane basis function; and
   (c) computing said pattern function by summing together all flashes evaluated at a point (x,y), said pattern function returning a 1 if (x,y) is inside a polygon and otherwise returning a 0.

4. A method for computing a two-dimensional convolution value for any point x,y on a polygonal pattern, said polygonal pattern having a finite number of face angles, said method comprising the steps of:
   (a) identifying a set of half-plane basis functions corresponding to each of said face angles;
   (b) convolving said half-plane basis functions with a convolution kernel using integration to find flash x,y values;
   (c) saving said convolved flash x,y values to a two-dimensional look-up table;
   (d) decomposing said polygonal pattern into a set of flashes where each of said flashes is an instance of said half-plane basis functions;
   (e) for point x,y, computing a convolution value by looking up a corresponding convolved flash x,y value for each flash in the table and summing together said corresponding convolved flash x,y values.

* * * * *